United States Patent [19]

Asghar et al.

[11] Patent Number: 4,878,200
[45] Date of Patent: Oct. 31, 1989

[54] PRODUCT TERM SHARING/ALLOCATION IN AN EPROM ARRAY

[75] Inventors: Abid Asghar, Fair Oaks; James R. Donnell, Shingle Springs, both of Calif.

[73] Assignee: Intel Corporation, Santa Clara, Calif.

[21] Appl. No.: 139,450

[22] Filed: Dec. 30, 1987

[51] Int. Cl.$^4$ .............................................. G11C 7/00
[52] U.S. Cl. ........................ 365/189.02; 365/189.08; 365/230.02
[58] Field of Search .............................. 365/189, 230

[56] References Cited

U.S. PATENT DOCUMENTS 4,609,986  9/1986  Hartmann et al. ................. 364/716
4,670,748  6/1987  Williams ............................. 365/189

OTHER PUBLICATIONS

Collett; "Programmable Logic Vendors Clash Over Functionality"; Digital Design; Oct., 1986; pp. 28 and 30.

Primary Examiner—James W. Moffitt
Attorney, Agent, or Firm—Blakely, Sokoloff, Taylor & Zafman

[57] ABSTRACT

An erasable programmable logic device which includes a programmable AND memory array and a macrocell processing the output of the AND array allows product term sharing/allocation by adjacent macrocells. Two groups of four product terms each are coupled to each macrocell, wherein the OR'ing of each group of four product terms is each coupled to a multiplexor. One group is also coupled to a previously adjacent macrocell and the second group is coupled to a subsequently adjacent macrocell. A third and fourth multiplexor accept four product terms from each of the adjacent macrocells and the output of the four multiplexors are coupled to an OR gate. When a multiplexor is activated, it couples each grouping of four product terms to the OR gate and the output of the OR gate is coupled to an I/O circuit which emulates combinatory and sequential logic circuits. By selecting appropriate multiplexors each eight product term macrocell is capable of processing 0, 4, 8, 12 or 16 product terms. An alternative embodiment has three groupings of product terms wherein only two of the groupings are shared by adjacent macrocells.

11 Claims, 3 Drawing Sheets

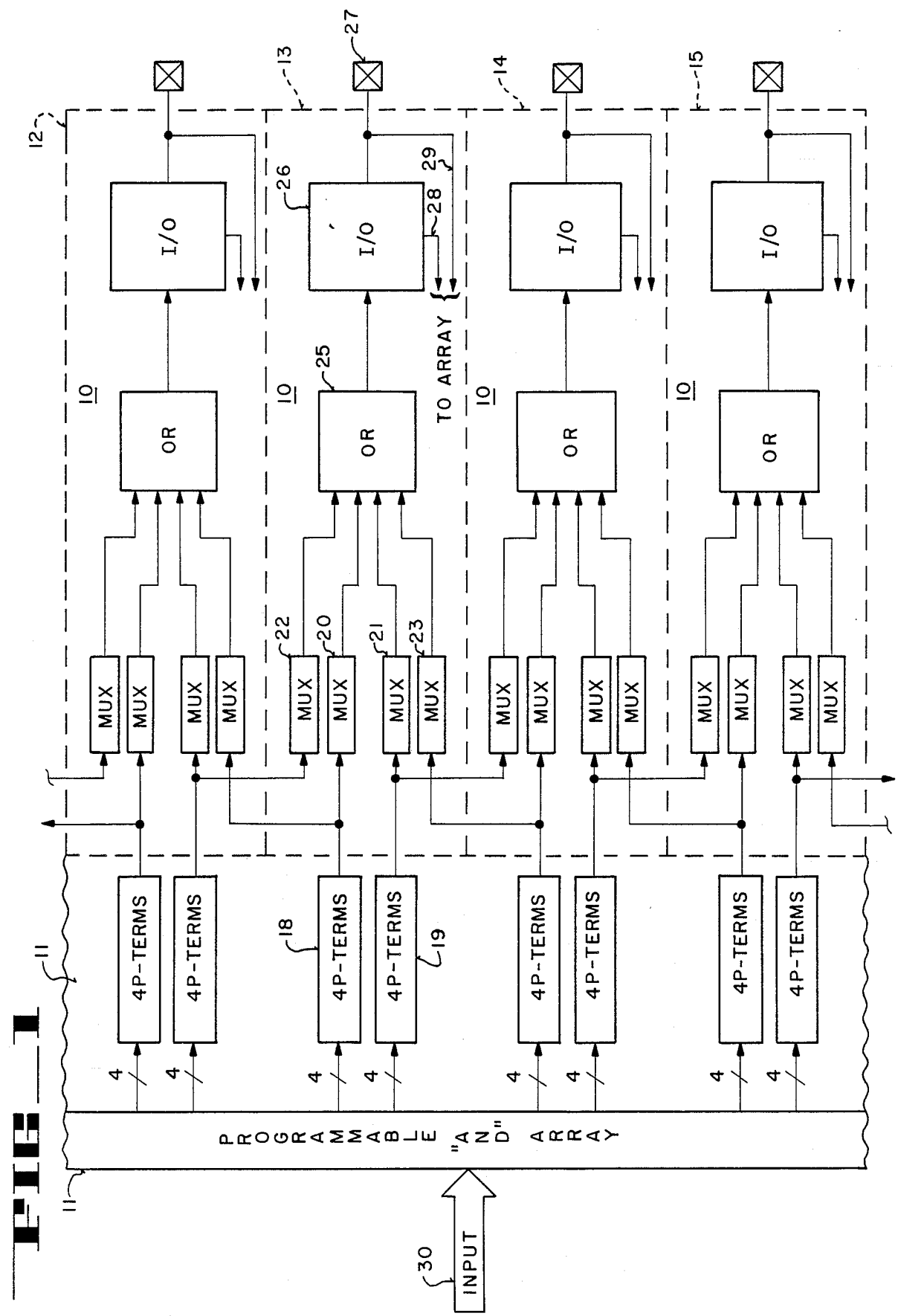

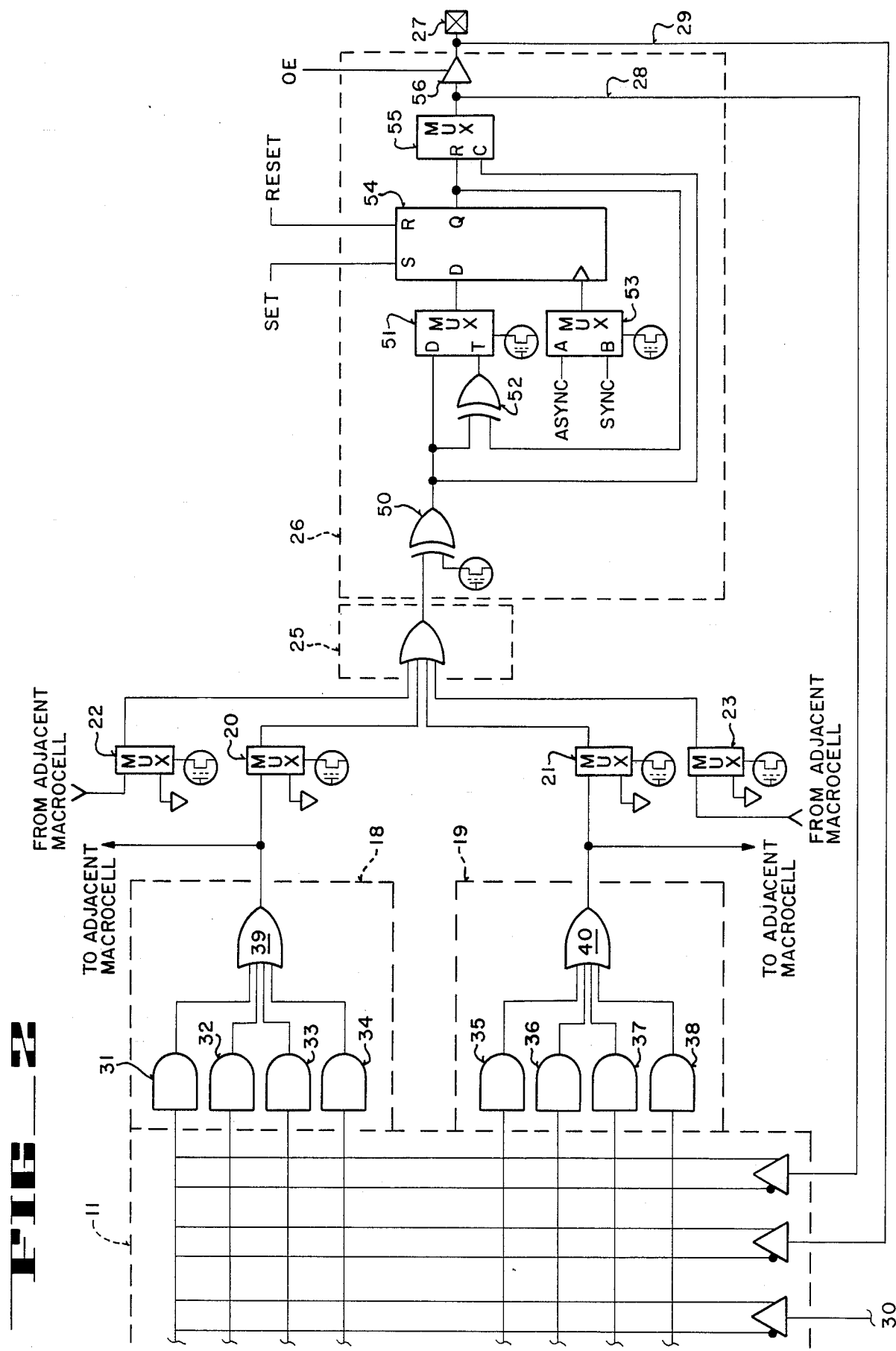
FIG_2

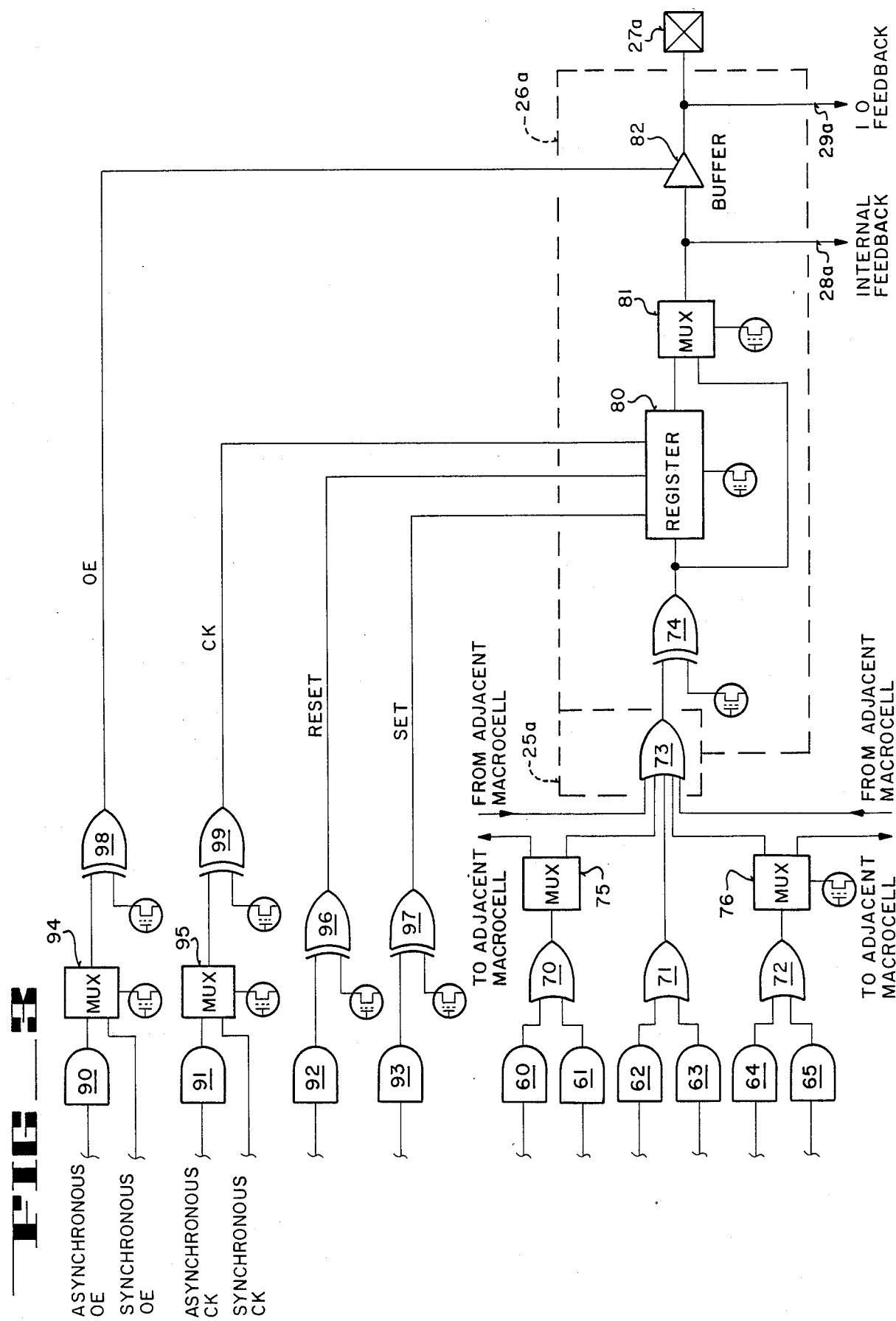
FIG_3

PRODUCT TERM SHARING/ALLOCATION IN AN EPROM ARRAY

BACKGROUND OF THE INVENTION

1. Field of the Invention

The present invention relates to the field of erasable programmable logic devices and more specifically to data flow in macrocells associated with an EPROM array.

2. Prior Art

The use of electrically programmable read-only-memories (EPROMs) is a well-known technology in the prior art. Recently, EPROM devices have been combined with programmable logic arrays (PLAs) and have provided a novel advancement in the area of erasable programmable logic devices (EPLD). One EPROM array architecture is disclosed in two U.S. Pat. Nos. 4,609,986 and 4,617,479 to Hartmann et al,. Such array architecture utilizes a plurality of EPROM cells which are arranged in a row and column matrix structure. Normally, outputs of the columns of an array are coupled as inputs to a macrocell architecture for further dynamic processing by circuits within the macrocell.

General use of macrocells in EPROM arrays is well-known in the prior art. In most instances, these macrocells are coupled to receive outputs from an "AND" array. The AND'ed outputs from the AND array are referred to as product terms and a number of these product terms are coupled as inputs to an OR gate to provide a sum of product term. The output of the OR gate is then coupled to an input/output (I/O) circuit which provides either a combinatorial logic or a sequential logic circuit. In most instances feedback lines from the I/O circuit are coupled back to the array. The use of such I/O configuration to provide combinatorial or sequential logic is well-known in the prior art.

As used in the prior art, each macrocell typically operates independently of other macrocells such that product terms of a given macrocell are provided to an I/O circuit of a given macrocell. For example, in a eight product term macrocell, if a given algorithm/logic requires less than eight terms, then the excess product term are unused and are wasted. If more than eight terms are required for a given logic function, then additional circuitry must be designed to couple a plurality of macrocells for this given function. Again for eight product term macrocells each additional macrocell will require the usage of product terms having a multiple of eight. That is, if ten product terms are required, then two macrocells are needed, resulting in six product terms of the second macrocell being unused.

It is appreciated that what is needed is an improved scheme in which product terms can be shared among macrocells and in which such sharing allows flexibility in the number of product terms shared.

SUMMARY OF THE INVENTION

The present invention describes an improved architecture which permits product terms of adjacent macrocells to be shared. A plurality of macrocells are coupled to a programmable AND memory array for receiving product terms from the array. Each macrocell is arranged to receive two groupings of four product terms each from the array. Each grouping of four product terms are OR'ed and this output is coupled for use in its own macrocell, as well as being coupled to an adjacent macrocell. One grouping of product terms is coupled to its own macrocell and to a previously adjacent macrocell. The other grouping of product terms is coupled to its own macrocell and to a subsequently adjacent macrocell. By this arrangement each macrocell not only permits the product terms to be coupled to adjacent macrocells but is also able to receive product terms from its own adjacent cells. For an eight product term macrocell having two groupings of four product terms, this macrocell can be operated by 0, 4, 8, 12 or 16 product terms, allowing flexibility in the programing of the memory array and the macrocell.

An alternative embodiment has three grouping of two product terms each for a macrocell. One grouping of OR'ed product term is shared with a subsequently adjacent macrocell and the second grouping of OR'ed product terms is shared with a previously adjacent macrocell. The third grouping of OR'ed product terms is only coupled to its own macrocell and not shared with either of the adjacent macrocells. A multiplexer coupled to each of the OR'ed outputs of the first and second groupings selects which macrocell these OR'ed outputs are destined.

BRIEF DESCRIPTION OF THE DRAWINGS

FIG. 1 is a block schematic diagram showing the product term sharing/allocation architecture of the present invention.

FIG. 2 is a circuit schematic diagram of the blocks shown in FIG. 1.

FIG. 3 is a circuit schematic diagram of an alternative embodiment showing a different sharing/allocation scheme.

DETAILED DESCRIPTION OF THE PRESENT INVENTION

An EPLD which permits product term sharing/allocation between adjacent macrocells is described. In the following description, numerous specific details are set forth, such as a specific EPROM PLA architecture, specific product term configurations, etc., in order to provide a thorough understanding of the present invention. It will be obvious, however, to one skilled in the art that the present invention may be practiced without the various specific details. In other instances, well-known circuits have not been described in detail in order not to unnecessarily obscure the present invention. Further, although the preferred embodiment is described in conjunction with a particular EPROM structure, it is evident to those skilled in the art that the present invention can be practiced with other EPLDs.

Referring to FIG. 1, a block schematic diagram of the present invention is shown. The present invention is comprised of an erasable programmable "AND" memory array 11 having inputs 30. Such arrays are well-known in the prior art and one such EPROM array is disclosed in Hartmann et al references (U.S. Pat. Nos. 4,609,986 and 4,617,479) mentioned earlier. A plurality of macrocells 10 are coupled to receive the outputs from array 11. Although only four macrocells 12–15 are shown in FIG. 1, the actual number of macrocells 10 for a given device is arbitrary and left as a design choice. Each macrocell 10 is designed to accept at least eight product terms from array 11. The eight product terms are further subdivided into two groups, each group comprising four product terms to accommodate a proprietary product term sharing/allocation scheme. In the preferred embodiment, additional product terms (not shown) are coupled to each macrocell to support secondary control signal generation, such as those control signals shown in FIG. 2. Although these control signals are necessary for the operation of the device, these signals are not pertinent to the understanding of the product term sharing/allocation scheme of the present invention.

For each macrocell 12-15, four product terms are coupled as a first group and the other four product terms are coupled as a second group 19. Groups 18 and 19, each provide an OR operation of the four product terms from the AND array 11. The output of the OR operation of groups 18 and 19 is a single output representing the OR'ing function of each of the four product terms. It is to be appreciated that the OR'ing function may be provided by various components, such as OR gates, NOR gates, etc.

The output of group 18 is coupled to a multiplexor (MUX) 20 of its own macrocell and also to a subsequently adjacent macrocell. The output of group 19 is coupled to MUX 21 of its own macrocell and also to a previously adjacent macrocell. MUX 22 is coupled to receive an output from an equivalent group 19 of the subsequently adjacent macrocell and MUX 23 is coupled to receive an output from an equivalent group 18 of the previously adjacent macrocell. The outputs of MUXs 20-23 are coupled to permit the passage of its respective inputs as inputs to OR gate 25. Again, it is stressed that other circuit components can be used for OR gate 25 to provide an equivalent function.

The output of OR gate 25 is coupled as an input to I/O circuit 26 and the output of I/O 26 is coupled to an output terminal 27 for signal transfer external to the EPLD device. I/O 26 can be comprised of a variety of circuits for providing either combinatorial or sequential logic functions. The output of I/O 26 is coupled as a feedback on line 29 to array 11 and an internal feedback of I/O 26 is coupled on line 28 to array 11. The feedback lines 28 and 29 are used to provide feedback for programmable logic operations.

Product term sharing (or allocation) is defined as taking logic resources from macrocells where these macrocells are not used to support demand for more than a specific number (eight in the preferred embodiment) of product terms and allocating them to other areas of a given chip. As implemented in the preferred embodiment, each macrocell 10 is capable of operating with 0., 4, 8, 12, or -16 product terms from the array 11. The actual number of terms selected as well as the location of the origin of these terms is determined by MUXs 20-23. The arrangement in which product terms are grouped, such as four in this instance, is arbitrary and determined by the designer.

When one grouping of four product terms is desired for a given macrocell, such as macrocell 13, one of MUX 20 or 21 of macrocell 13 is selected. Although MUX 22 or MUX 23 could be selected to use product term grouping from macrocell 12 or macrocell 14, respectively, the preference is to use product terms of its own macrocell 13. Further, because of the architecture, a particular grouping 18 or 19 can be used by both its own macrocell and its adjacent macrocell. For use of 8 or 12 terms, applicable MUXs are selected. When all sixteen product terms are to be utilized, then all MUXs 20-23 cause inputs to be passed to OR gate 25 such that the two grouping of product terms from its own macrocell along with the adjacent four product terms from the previous macrocell and the adjacent four product terms from the subsequent macrocell are coupled to operate with the given macrocell. This scheme is replicated throughout each of the macrocells 10 of FIG. 1.

Referring to FIG. 2, a circuit schematic diagram of the block diagram of FIG. 1 is shown. Because the array structure 11 is well-known in the prior art, only one of the row input lines 30 with its associated driver, is shown. It is to be appreciated that the intersection of the row and column lines forming the matrix within array 11 represents a given memory cell of the array 11. Inputs to the array 11 are shown on line 30. Other circuits, such as decoder circuits, which typically operate with array 11 are not shown, but are well-known in the prior art.

In the preferred embodiment four product terms are shown as outputs of AND gates 31-34 and four product terms as outputs of AND gates 35-38. These AND gates represent the outputs of AND array 11, which outputs form the product terms for groups 18 and 19. The AND gates 31-34 are coupled as inputs to OR gate 39 wherein the output of OR gate 39 provides an output of group 18 and represents an OR'ed product term. Equivalently, the four product terms for group 19 are coupled as inputs to OR gate 40. The output of OR gate 40 provide the OR'ed product term of group 19. The OR'ed product term of group 18 is coupled as an input to MUX 20 and is also coupled to a subsequently adjacent macrocell. Equivalently, the OR'ed product term of group 19 is coupled as an input to MUX 21 and also to the previously adjacent macrocell.

MUX 22 receives an OR'ed product term from group 19 of the subsequently adjacent macrocell and MUX 23 receives an OR'ed product term from group 18 of he previously adjacent macrocell. In the preferred embodiment each of the MUXs 20-23 also have a second input coupled to ground such that a separate control signal to each of the MUXs 20-23 selects between the appropriate OR'ed product term or ground. Therefore, the control signal for MUXs 20-23 selects between a ground references level (zero input) and the input from one of the OR'ed product terms. The output of the MUXs 20-23 are coupled as input to OR gate 25 which output is then coupled as an input to I/O 26. When a particular OR'ed product term is to be used its appropriate MUX 20-23 will permit the OR'ed product term to be coupled through to OR gate 25. When a given OR'ed product term is not to be used by the given macrocell, the appropriate MUX will select ground for coupling to its output.

If a macrocell is to use one group of product terms, then one of MUXs 20-23 will be selected for coupling to OR gate 25. When eight product terms are to be selected, then two of the MUXs 20-23 will be selected, etc. Also, the macrocells at the ends can be made to wrap-around to each other so that a loop is formed permitting all macrocells to have two adjacent cells.

Although a variety of circuits can be implemented with an I/O 26, the preferred embodiment utilizes the circuit of FIG. 2. The output of OR gate 25 is coupled as one input to exclusive OR (XOR) gate 50 while a control signal is coupled as a second input to XOR gate 50. The output of XOR gate 50 is coupled as a first input of MUX 51, a first input to XOR gate 52 and as a second input of MUX 55. The output of MUX 51 is coupled as an input to flip-flop 54 and the output of flip-flop of 54 is coupled to a first input of MUX 55, as well as to a second input of XOR gate 52. The output of XOR gate 52 is coupled as a second input to MUX 51. Another MUX 53 has its output coupled to a clock input of flip-flop 54 such that MUX 53 selects between synchronous and asynchronous signals at its input. The output of MUX 55 is coupled to output driver 56 and to feedback line 28. The output of driver 56 is coupled to the output terminal 27, as well as feedback on line 29. Control signals are coupled to MUXs 51, 53, 55, as well as to set and reset inputs of flip-flop 54 and as output enable signal OE to driver 56. Although various control signals can be generated off chip, in the preferred embodiment these control signals are derived from designated product terms (other than those of group 18 and 19) of array 11. Further, macrocells can be utilized to provide control signals to other macrocells without departing from the spirit and scope of the invention.

As used in the preferred embodiment each macrocell is capable of emulating various combinatorial logic and sequential logic circuits by appropriate programing of array 11. For example, D and T type flip-flops are selected by MUX 51. JK flip-flops are emulated through a toggle feedback path internal to the device. A SR flip-flop is implemented by using the product term control set and reset functions available to each I/O 26. MUX 53 permits the selection of synchronous or asynchronous clocking of I/O 26. MUX 55 selects between combinatorial logic output of XOR gate 50 or sequential logic output of flip-flop 54. Control signal OE permits the output to be enabled on to terminal 27. The dual feedback scheme on feedback lines 28 and 29 provides the designer with an added advantage of selecting a feedback on line 28 when driver 56 is not enabled. This permits a buried register implementation wherein feedback is provided from I/O 26 when the output has not be enabled. The two additional product terms earlier stated control set and reset signals of flip-flop 54, signal OE and selection between synchronous and asynchronous clocking to flip-flop 54.

Referring to FIG. 3, an alternative embodiment using three groupings of two product terms each is illustrated. A first and second product terms are shown as outputs of AND gates 60 and 61, wherein these outputs are coupled as inputs to OR gate 70. A third and fourth product terms are represented as outputs of AND gates 62 and 63 and are coupled as inputs to OR gate 71. A fifth and sixth product terms are represented as outputs of AND gates 64 and 65 and coupled as inputs to OR gate 72.

The output of OR gate 70 is coupled to MUX 75 which has one output coupled as an input to OR gate 73 and a second output coupled to a subsequently adjacent macrocell. That is, MUX 75 places the output of OR gate 70 either as an input to OR gate 73 or to the subsequently adjacent macrocell. The output of OR gate 72 is coupled as an input to MUX 76, wherein one output of MUX 76 is coupled as an input to OR gate 73 and a second output of MUX 76 is coupled to a previously adjacent macrocell. Therefore, MUX 76 places the output of OR gate 72 either as an input to OR gate 73 or as an input to the previously adjacent macrocell. The output of OR gate 71 is coupled as an input to OR gate 73 and is not coupled to any of the adjacent macrocells.

Both MUXs 75 and 76 have their output selection controlled by a select signal, which in this instance is the state of one of the memory cells of the EPROM array. This is shown by a circle enclosing an EPROM memory cell. The output of OR gate 73 is coupled as one input of XOR gate 74 wherein a second input of XOR gate 74 is from one of the memory cells. XOR gate 74 and the subsequent circuit components comprise I/O 26a. The output of I/O 26a is then coupled to output terminal 27a. It is to be appreciated that a variety of I/O circuits can be implemented with I/O 26a, including the specific I/O 26 shown in FIG. 2. The OR gate 73 is shown enclosed by dotted line 25a to show that it is equivalent to circuit 25 of FIG. 2.

I/O 26a of the alternative embodiment is comprised of a register 80, MUX 81 and buffer 82. The output of XOR gate 74 is coupled as an input to register 80 as well as to one input of MUX 81. The output of register 80 is coupled as a second input to MUX 81. MUX 81 selects between one of its inputs and couples it to buffer 82 and also on internal feedback line 28a. The output of buffer 82 is coupled to terminal 27a as well as I/O feedback on line 29a. An EPROM cell controls MUX 81 and another EPROM cell enables register 80. Set, reset, clock and output enable lines are coupled to I/O 26a to control register 80 and output buffer 82. As shown in FIG. 2 the signals can emanate from various sources, however, as shown in the alternative embodiment of FIG. 3 these four signals are derived from other product terms or from a synchronous source. A product term represented as an output of AND gate 90 is coupled as one input to MUX 94 provides an asynchronous output enable signal. A synchronous output enable signal is coupled as a second input to MUX 94 and an EPROM cell controls the selection of one of these inputs as an output of MUX 94. The output of MUX 94 is coupled as an input to XOR gate 94. An EPROM cell provides the other input to XOR gate 98, wherein the output enable signal which controls the enabling of buffer 82 is outputed from XOR gate 98.

Equivalently, an asynchronous clock signal and a synchronous clock signal are coupled in an equivalent arrangement as shown by AND gate 91, MUX 95 and XOR gate 99 to provide a clock signal to register 80. A reset signal is derived from a product term being coupled through XOR gate 96 and a set signal is derived from product term of AND gate 93 being coupled through XOR gate 97. Both XOR gates 96 and 97 have their second inputs coupled to a respective memory cell.

It is to be appreciated that the I/O circuit 26a and the derivation of the associated control signals can be changed without departing from the spirit and scope of the present invention. In this alternative embodiment, it is evident that two product terms are always coupled to its macrocell and not to adjacent macrocells, as is shown by product terms of AND gates 62 and 63. The other two groupings can be coupled to its own macrocell or to its respective adjacent macrocells. Again, the actual number of product terms in each grouping is arbitrary and left to the designer for specific applications.

Thus, an architecture for product term sharing by adjacent macrocells is described.

We claim:

1. An erasable programmable logic device (EPLD) having a programmable memory array coupled to receive a plurality of input signals and, by providing a plurality of output signals which depend on said input signals and information stored in said memory array, said output from said memory array coupled to a plurality of macrocells, wherein product terms are shared between adjacent macrocells, each macrocell comprising:

a first OR'ing means coupled to receive a first predetermined number of output lines from said memory array;

a second OR'ing means coupled to receive a second predetermined number of output lines from said memory array;

said first and second OR'ing means each for providing an OR'ing function of its coupled predetermined number of output lines from said memory array;

a first multiplexor coupled to said first OR'ing means for receiving a first OR'ed output of said first OR'ing means;

a second multiplexor coupled to said second OR'ing means for receiving a second OR'ed output of said second OR'ing means;

said first OR'ed output of said first OR'ing means is also coupled to a subsequently adjacent macrocell;

said second OR'ed output of said second OR'ing means also is coupled to a previously adjacent macrocell;

a third multiplexor coupled to receive a second OR'ed output of said second OR'ing means of said subsequently adjacent macrocell; and a fourth multiplexor coupled to receive a first OR'ed output of said first OR'ing means of said previously adjacent macrocell;

a third OR'ing means coupled to receive outputs of said first, second, third and fourth multiplexors such that each of said OR'ed outputs is coupled to said third OR'ing means when said respective multiplexor is selected;

an input/output (I/O) circuit coupled to receive an output of said third OR'ing means, said I/O circuit for emulating logic functions and providing an output from said macrocell.

2. The EPLD of claim 1 wherein said first, second, third and fourth multiplexors are controlled by additional product terms from said memory array.

3. The EPLD of claim 2 wherein said I/O circuit is capable of emulating combinatorial and sequential logic operations.

4. The EPLD of claim 3, wherein said memory array is an EPROM AND array.

5. An erasable programmable logic device (EPLD) having a programmable AND memory array coupled to receive a plurality of input signals and providing a plurality of output signals which depend on said input signals and information stored in said memory array, said output from said memory array coupled to a plurality of macrocells, wherein product terms are shared between adjacent macrocells, each macrocell comprising:

a first OR'ing means coupled to receive a first group of four product terms as output from said memory array;

a second OR'ing means coupled to receive a second group of four product terms as output from said memory array;

said first and second OR'ing means each for providing an OR'ing function of its coupled product terms;

a first multiplexor coupled to said first OR'ing means for receiving a first OR'ed output of said first OR'ing means;

a second multiplexor coupled to said second OR'ing means for receiving a second OR'ed output of said second OR'ing means;

said output of said first OR'ing means is also coupled to a subsequently adjacent macrocell;

said output of said second OR'ing means is also coupled to a previously adjacent macrocell;

a third multiplexor coupled to receive a second OR'ed output of said second OR'ing means of said subsequently adjacent macrocell; and a fourth multiplexor coupled to receive a first OR'ed output of said first OR'ing means of said previously adjacent macrocell;

a third OR'ing means coupled to receive outputs of said first, second, third and fourth multiplexors such that each of said OR'ed outputs is coupled to said third OR'ing means when said respective multiplexor is selected, each said multiplexor when selected passes OR'ed combination of four different product terms;

an input/output (I/O) circuit coupled to receive an output of said third OR'ing means, said I/O circuit for emulating logic functions and providing an output from said macrocell.

6. The EPLD of claim 5 wherein said I/O circuit is capable of emulating combinatorial and sequential logic operations.

7. An erasable programmable logic device (EPLD) having a programmable memory array coupled to receive a plurality of input signals and by providing a plurality of output signals which depend on said input signals and information stored in said memory array, said output from said memory array coupled to a plurality of said macrocells, each macrocell comprising:

a first OR'ing means coupled to receive a first predetermined number of output lines from said memory array;

a second OR'ing means coupled to receive a second predetermined number of output lines from said memory array;

a third OR'ing means coupled to receive a third predetermined number of output lines from said memory array;

a said first, second and third OR'ing means each for providing an OR'ing function of its coupled predetermined number of lines from said memory array;

a first multiplexor coupled to said first OR'ing means for receiving a first OR'ed output of said first OR'ing means;

a second multiplexor coupled to said second OR'ing means for receiving a second OR'ed output of said second OR'ing means;

a fourth OR'ing means;

said first multiplexor having its first output coupled to said fourth OR'ing means and its second output coupled to a subsequently adjacent macrocell, wherein said first multiplexor causes said first OR'ed output to be placed on one of its outputs;

said second multiplexor having its first output coupled to said fourth OR'ing means and its second output coupled to a previously adjacent macrocell, wherein said second multiplexor causes said second OR'ed output to be placed on one of its outputs;

said third OR'ing means coupling a third OR'ed output to said fourth OR'ing means;

an input/output (I/O) circuit coupled to receive an output of said fourth OR'ing means, said I/O circuit for emulating logic functions and providing an output from said macrocell.

8. The EPLD of claim 7, wherein said first and second multiplexors are controlled by additional product terms from said memory array.

9. The EPLD of claim 8, wherein said I/O circuit is capable of emulating combinatorial and sequential logic operations.

10. The EPLD of claim 9, wherein said memory array is an EPROM AND array.

11. The EPLD of claim 7, wherein said first, second and third OR'ing means each provides OR'ing of two product terms from said memory array.

* * * * *

UNITED STATES PATENT AND TRADEMARK OFFICE
CERTIFICATE OF CORRECTION

PATENT NO. : 4,878,200

DATED : 10/31/89

INVENTOR(S) : Asghar et al.

It is certified that error in the above-identified patent and that said Letters Patent is hereby corrected as shown below:

col. 02, line 14     delete "term"     insert --terms-- col. 04, line 33     delete "he"     insert --the--

Signed and Sealed this

Third Day of December, 1991

Attest:

HARRY F. MANBECK, JR.

*Attesting Officer*     *Commissioner of Patents and Trademarks*